(12) United States Patent
Tsai et al.

(10) Patent No.: US 11,114,311 B2
(45) Date of Patent: Sep. 7, 2021

(54) CHIP PACKAGE STRUCTURE AND METHOD FOR FORMING THE SAME

(71) Applicant: Taiwan Semiconductor Manufacturing Co., Ltd., Hsinchu (TW)

(72) Inventors: Po-Hao Tsai, Zhongli (TW); Shih-Ting Hung, New Taipei (TW); Shin-Puu Jeng, Hsinchu (TW); Techi Wong, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/242,311

(22) Filed: Jan. 8, 2019

(65) Prior Publication Data

US 2020/0075350 A1 Mar. 5, 2020

Related U.S. Application Data

(60) Provisional application No. 62/724,838, filed on Aug. 30, 2018.

(51) Int. Cl.
| | |
|---|---|
| *H01L 21/56* | (2006.01) |
| *H01L 23/538* | (2006.01) |
| *H01L 23/00* | (2006.01) |
| *H01L 25/18* | (2006.01) |

(52) U.S. Cl.
CPC .......... *H01L 21/565* (2013.01); *H01L 21/563* (2013.01); *H01L 23/5383* (2013.01); *H01L 23/5386* (2013.01); *H01L 24/09* (2013.01); *H01L 24/17* (2013.01); *H01L 25/18* (2013.01); *H01L 2224/0231* (2013.01); *H01L 2224/02373* (2013.01)

(58) Field of Classification Search
CPC ........... H01L 23/3142; H01L 23/16–26; H01L 2224/023–024; H01L 2224/1403; H01L 2224/16155–16168; H01L 2224/16225–1624
See application file for complete search history.

(56) References Cited

U.S. PATENT DOCUMENTS

| | | | | |
|---|---|---|---|---|
| 2012/0056316 | A1* | 3/2012 | Pagaila | H01L 23/5389 257/737 |
| 2014/0252645 | A1* | 9/2014 | Kim | H01L 23/3677 257/774 |
| 2015/0228594 | A1* | 8/2015 | Alvarado | H01L 24/06 257/737 |
| 2017/0133351 | A1* | 5/2017 | Su | H01L 25/105 |
| 2017/0365581 | A1* | 12/2017 | Yu | H01L 23/3142 |

(Continued)

*Primary Examiner* — Joseph M Galvin, III
(74) *Attorney, Agent, or Firm* — Birch, Stewart, Kolasch & Birch, LLP

(57) ABSTRACT

A method for forming a chip package structure is provided. The method includes forming a conductive structure over a substrate. The substrate includes a dielectric layer and a wiring layer in the dielectric layer, and the conductive structure is electrically connected to the wiring layer. The method includes forming a first molding layer over the substrate and surrounding the conductive structure. The method includes forming a redistribution structure over the first molding layer and the conductive structure. The method includes bonding a chip structure to the redistribution structure.

20 Claims, 9 Drawing Sheets

(56) References Cited

U.S. PATENT DOCUMENTS

2018/0012774 A1* 1/2018 Hu .................. H01L 21/6835
2019/0131242 A1* 5/2019 Lee .................. H01L 23/49833
2019/0341368 A1* 11/2019 Hu .................. H01L 23/5389
2019/0385977 A1* 12/2019 Elsherbini ............. H01L 24/13

* cited by examiner

CHIP PACKAGE STRUCTURE AND METHOD FOR FORMING THE SAME

PRIORITY CLAIM AND CROSS-REFERENCE

This application claims the benefit of U.S. Provisional Application No. 62/724,838, filed on Aug. 30, 2018, and entitled "CHIP PACKAGE STRUCTURE AND METHOD FOR FORMING THE SAME", the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating layers or dielectric layers, conductive layers, and semiconductor layers over a semiconductor substrate, and patterning the various material layers using photolithography processes and etching processes to form circuit components and elements thereon.

With the evolving of semiconductor technologies, semiconductor chips/dies are becoming increasingly smaller. In the meantime, more functions need to be integrated into the semiconductor dies. As a result, the packaging of the semiconductor dies becomes more difficult.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
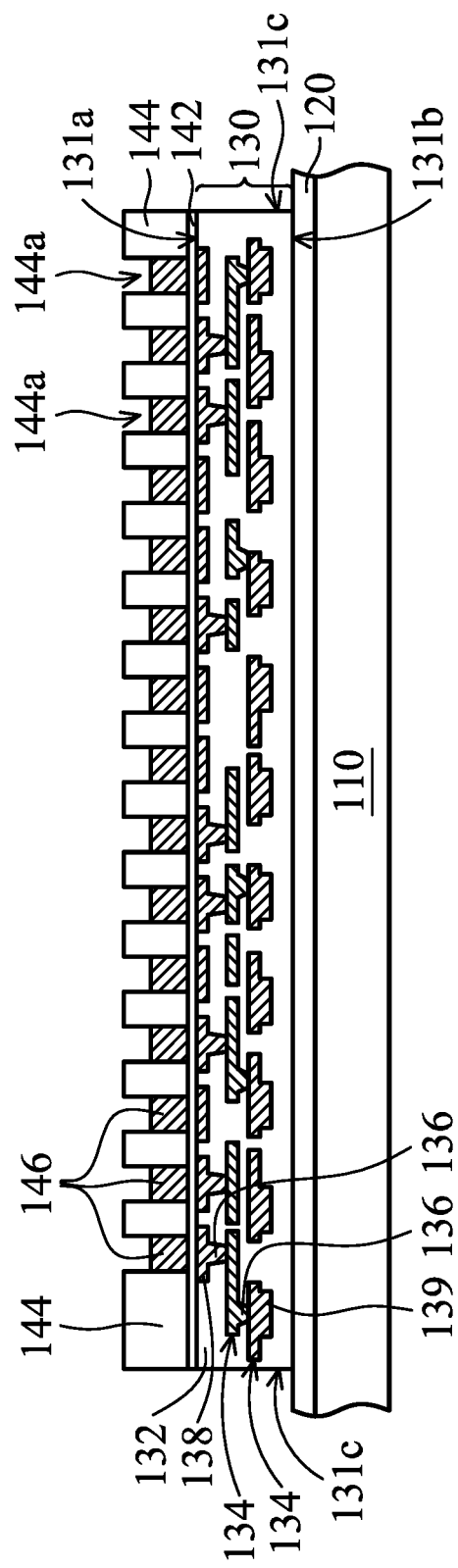
FIGS. 1A-1I are cross-sectional views of various stages of a process for forming a chip package structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

FIGS. 1A-1I are cross-sectional views of various stages of a process for forming a chip package structure, in accordance with some embodiments. As shown in FIG. 1A, a carrier substrate 110 is provided, in accordance with some embodiments. The carrier substrate 110 is configured to provide temporary mechanical and structural support during subsequent processing steps, in accordance with some embodiments. The carrier substrate 110 includes glass, silicon, silicon oxide, aluminum oxide, metal, a combination thereof, and/or the like, in accordance with some embodiments. The carrier substrate 110 includes a metal frame, in accordance with some embodiments.

As shown in FIG. 1A, an adhesive layer 120 is formed over the carrier substrate 110, in accordance with some embodiments. The adhesive layer 120 is in direct contact with the carrier substrate 110, in accordance with some embodiments. The adhesive layer 120 is conformally formed on the carrier substrate 110, in accordance with some embodiments. The adhesive layer 120 is made of an insulating material, such as a polymer material, in accordance with some embodiments. The adhesive layer 120 is formed using a coating process or another suitable process.

As shown in FIG. 1A, a substrate 130 is disposed over the adhesive layer 120, in accordance with some embodiments. The substrate 130 has surfaces 131a and 131b and a sidewall 131c, in accordance with some embodiments. The surface 131a faces away from the carrier substrate 110, in accordance with some embodiments. The surface 131a is opposite to the surface 131b, in accordance with some embodiments. The sidewall 131c is between the surfaces 131a and 131b, in accordance with some embodiments. The sidewall 131c is adjacent to the surfaces 131a and 131b, in accordance with some embodiments.

The substrate 130 includes a dielectric layer 132, wiring layers 134, conductive vias 136, and conductive pads 138 and 139, in accordance with some embodiments. The wiring layers 134, the conductive vias 136, and the conductive pads 138 and 139 are in the dielectric layer 132, in accordance with some embodiments. Some of the conductive vias 136 electrically connect between the wiring layers 134, in accordance with some embodiments. Other conductive vias 136 electrically connect between the wiring layers 134 and the conductive pads 138, in accordance with some embodiments.

The wiring layers 134, the conductive vias 136, and the conductive pads 138 and 139 are electrically connected to each other, in accordance with some embodiments. The dielectric layer 132 is made of a polymer material or another suitable material. The dielectric layer 132 includes, for example, a fiber material such as a glass fiber material, a prepreg material such as a polymer material, ABF (Ajinomoto Build-up Film), a solder resist material, or a combination thereof. The wiring layers 134, the conductive vias 136, and the conductive pads 138 and 139 are made of a conductive material, such as copper, aluminum, or tungsten, in accordance with some embodiments.

As shown in FIG. 1A, a seed layer 142 is formed over the substrate 130, in accordance with some embodiments. The seed layer 142 is formed over the conductive pads 138 and the dielectric layer 132, in accordance with some embodiments. The seed layer 142 is in direct contact with the conductive pads 138 and the dielectric layer 132, in accordance with some embodiments. The seed layer 142 is made of titanium, copper, and/or another suitable conductive material, in accordance with some embodiments. The seed layer 142 is formed using a deposition process, such as a physical vapor deposition process, in accordance with some embodiments.

As shown in FIG. 1A, a mask layer 144 is formed over the seed layer 142, in accordance with some embodiments. The mask layer 144 has openings 144a, in accordance with some embodiments. The openings 144a expose portions of the seed layer 142, in accordance with some embodiments. The mask layer 144 is made of a polymer material such as a photoresist material, in accordance with some embodiments. The mask layer 144 is formed using a coating process and a photolithography process, in accordance with some embodiments.

As shown in FIG. 1A, a conductive layer 146 is formed in the openings 144a, in accordance with some embodiments. The conductive layer 146 is made of a conductive material, such as copper, aluminum, or tungsten, in accordance with some embodiments. The conductive layer 146 is formed using a plating process (e.g., an electro-plating process or an electroless plating process) or another suitable process, in accordance with some embodiments.

Figure 1B:
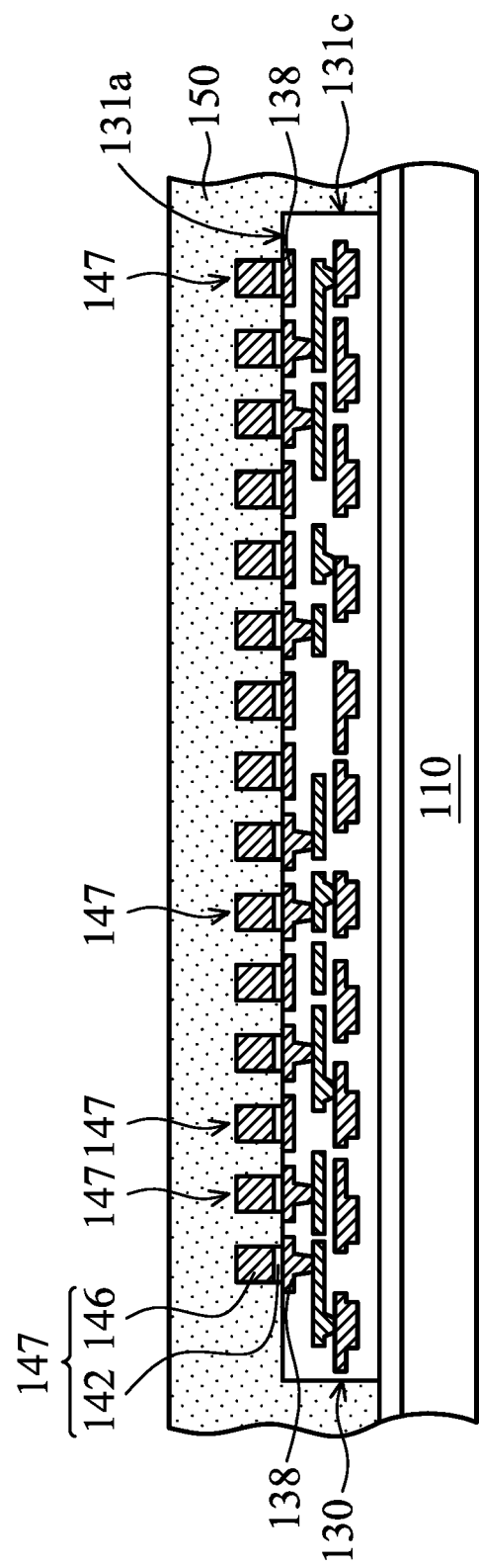

As shown in FIG. 1B, the mask layer 144 is removed, in accordance with some embodiments. As shown in FIG. 1B, the seed layer 142 originally under the mask layer 144 is removed, in accordance with some embodiments. As shown in FIG. 1B, the conductive layer 146 and the seed layer 142 under the conductive layer 146 together form conductive structures 147, in accordance with some embodiments. In some other embodiments, the conductive structures 147 are formed over the substrate 130 before the substrate 130 is disposed over the adhesive layer 120.

The conductive structures 147 include conductive pillars and/or conductive traces (or wires), in accordance with some embodiments. Each conductive structure 147 is electrically connected to the conductive pad 138 thereunder, in accordance with some embodiments. Each conductive structure 147 is in direct contact with the conductive pad 138 thereunder, in accordance with some embodiments. In some embodiments, the conductive structures 147 are conductive traces, and the conductive traces match the routing of wiring layers formed subsequently.

As shown in FIG. 1B, a molding layer 150 is formed over the carrier substrate 110 to cover the substrate 130 and the conductive structures 147, in accordance with some embodiments. The molding layer 150 covers the surface 131a and the sidewall 131c of the substrate 130, in accordance with some embodiments. The molding layer 150 is in direct contact with the substrate 130 and the conductive structures 147, in accordance with some embodiments. The molding layer 150 includes a polymer material, in accordance with some embodiments. The molding layer 150 is formed using a molding process, in accordance with some embodiments.

The molding layer 150 includes a polymer material, in accordance with some embodiments. The term "polymer" can represent thermosetting polymers, thermoplastic polymers, or any mixtures thereof, in accordance with some embodiments. The polymer material can include, for example, plastic materials, epoxy resin, polyimide, polyethylene terephthalate (PET), polyvinyl chloride (PVC), polymethylmethacrylate (PMMA), polymer components doped with specific fillers including fiber, clay, ceramic, inorganic particles, or any combinations thereof. In other embodiments, the molding layer 150 can be made of epoxy resin, such as epoxy cresol novolac (ECN), biphenyl epoxy resin, multifunctional liquid epoxy resin, or any combinations thereof, in accordance with some embodiments. In still other embodiments, the molding layer 150 can be made of epoxy resin optionally including one or more fillers to provide the composition with any of a variety of desirable properties. Examples of fillers can be aluminum, titanium dioxide, carbon black, calcium carbonate, silica, or any combinations thereof, in accordance with some embodiments.

Figure 1C:
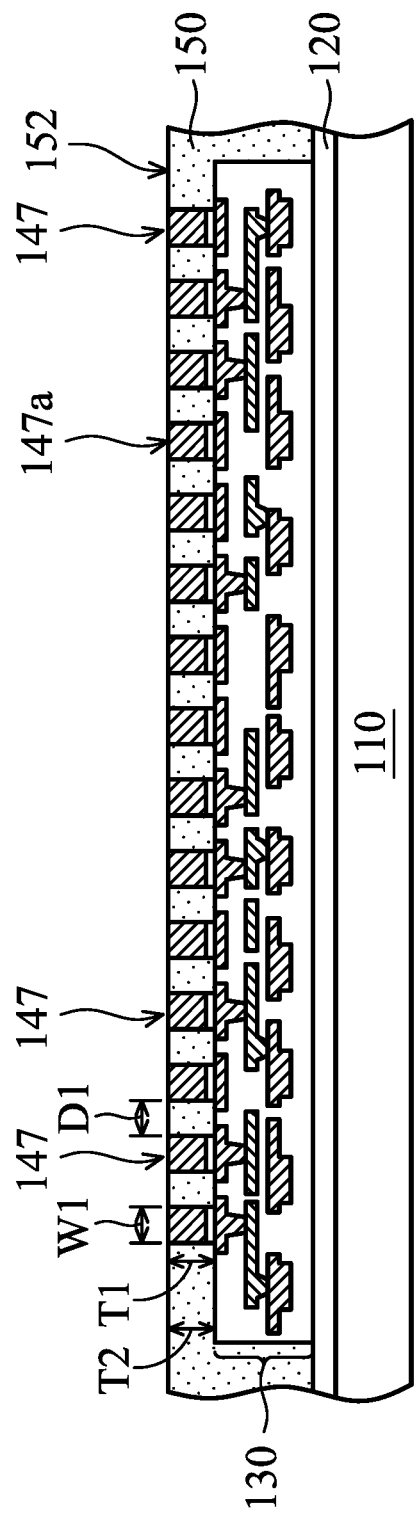

As shown in FIG. 1C, an upper portion of the molding layer 150 is removed to expose the conductive structures 147, in accordance with some embodiments. The removal process includes a planarization process such as a chemical mechanical polishing process (CMP process), in accordance with some embodiments. Therefore, after the removal process, a top surface 147a of each conductive structure 147 is coplanar with a top surface 152 of the molding layer 150.

The molding layer 150 continuously surrounds the conductive structures 147 and the entire substrate 130, in accordance with some embodiments. The conductive structures 147 pass through the molding layer 150 over the substrate 130, in accordance with some embodiments. In some embodiments, a thickness T1 of the conductive structure 147 ranges from about 2 μm to about 50 μm. In some embodiments, the thickness T1 of the conductive structure 147 ranges from about 20 μm to about 50 μm. In some embodiments, a thickness T2 of the molding layer 150 over the substrate 130 ranges from about 2 μm to about 50 μm. In some embodiments, the thickness T2 of the molding layer 150 over the substrate 130 ranges from about 20 μm to about 50 μm.

The thickness T1 of the conductive structure 147 is substantially equal to the thickness T2 of the molding layer 150 over the substrate 130, in accordance with some embodiments. The term "substantially equal to" in the application means "within 10%", in accordance with some embodiments. For example, the term "substantially equal to" means the difference between the thicknesses T1 and T2 is within 10% of the average thickness between the conductive structure 147 and the molding layer 150 over the substrate 130, in accordance with some embodiments. The difference may be due to manufacturing processes. In some embodiments, a width W1 of the conductive structure 147 ranges from about 5 μm to about 200 μm. In some embodiments, a width W1 of the conductive structure 147 ranges from about 15 μm to about 30 μm. In some embodiments, a distance D1 between the conductive structures 147 ranges from about 10 μm to about 400 μm. In some embodiments, the distance D1 between the conductive structures 147 ranges from about 10 μm to about 20 μm.

Figure 1D:
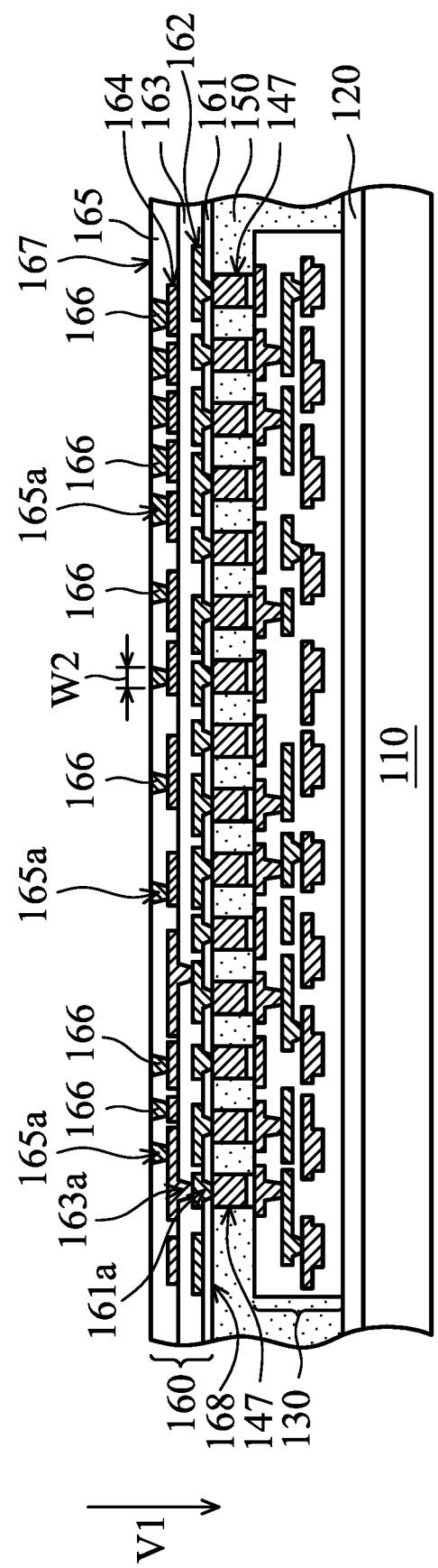

As shown in FIG. 1D, a redistribution structure 160 is formed over the molding layer 150 and the conductive structures 147, in accordance with some embodiments. The redistribution structure 160 is in direct contact with the conductive structures 147 and the molding layer 150, in accordance with some embodiments.

The formation of the redistribution structure 160 includes: forming a dielectric layer 161 over the molding layer 150 and the conductive structures 147, wherein the dielectric layer 161 has openings 161a respectively exposing the conductive structures 147 thereunder; forming a wiring layer 162 over the dielectric layer 161 and in the openings 161a to electrically connect to the conductive structures 147; forming a dielectric layer 163 over the dielectric layer 161 and the wiring layer 162, wherein the dielectric layer 163 has openings 163a partially exposing the wiring layer 162; forming a wiring layer 164 over the dielectric layer 163 and in the openings 163a to electrically connect to the wiring layer 162; forming a dielectric layer 165 over the dielectric layer 163 and the wiring layer 164, wherein the dielectric layer 165 has openings 165a partially exposing the wiring layer 164; and forming conductive pads 166 in the openings 165a.

The formation of each of the dielectric layers 161, 163, and 165 includes a deposition process (e.g., a chemical vapor deposition process or a physical vapor deposition process), a photolithograph process, and an etching process, in accordance with some embodiments. The formation of each of the wiring layers 162 and 164 and the conductive pads 166 includes a photolithograph process, a plating process, and an etching process, in accordance with some embodiments.

The dielectric layer 161 is conformally formed on the molding layer 150 and the conductive structures 147, in accordance with some embodiments. In some embodiments, a width W2 of the conductive pad 166 decreases along a direction V1 from a top surface 167 of the redistribution structure 160 to a bottom surface 168 of the redistribution structure 160. The width W2 of the conductive pad 166 is less than a width of the opening 163a, in accordance with some embodiments. The width of the opening 163a is less than a width of the opening 161a, in accordance with some embodiments.

The dielectric layers 161, 163, and 165 are made of an insulating material such as a polymer material (e.g., polybenzoxazole, polyimide, or a photosensitive material), nitride (e.g., silicon nitride), oxide (e.g., silicon oxide), silicon oxynitride, or the like, in accordance with some embodiments. The wiring layers 162 and 164 and the conductive pads 166 are made of a conductive material, such as metal (e.g. copper, aluminum, or tungsten), in accordance with some embodiments.

Figure 1E:
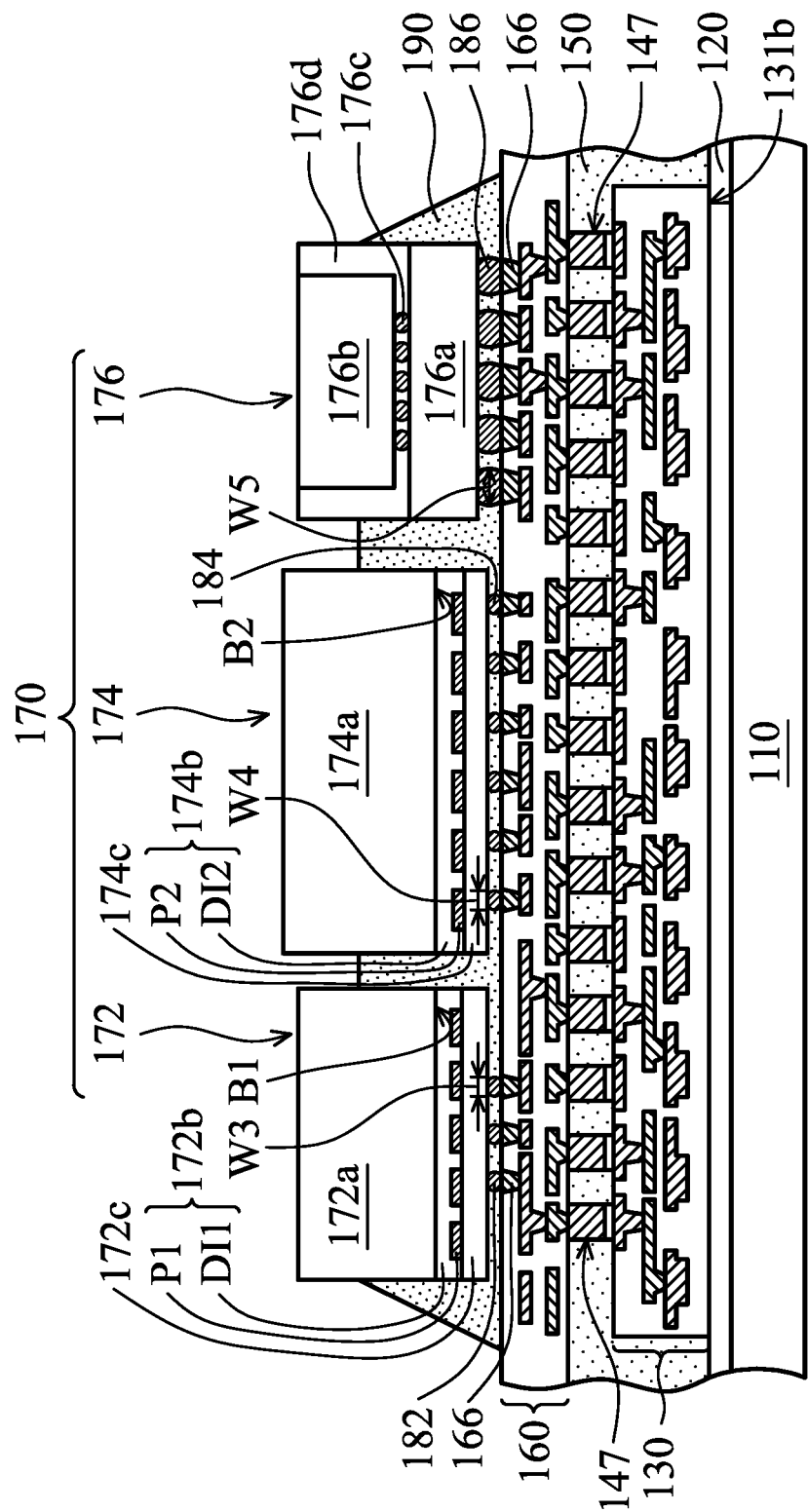

As shown in FIG. 1E, chip structures 170 are bonded to the redistribution structure 160 through conductive bumps 182, 184, and 186, in accordance with some embodiments. The chip structures 170 include chips 172 and 174 and a chip package 176, in accordance with some embodiments.

The chips 172 and 174 and the chip package 176 are electrically connected to the conductive pads 166 of the redistribution structure 160 through conductive bumps 182, 184, and 186, in accordance with some embodiments. The chips 172 and 174 and the chip package 176 are electrically connected to the substrate 130 through the redistribution structure 160 and the conductive structures 147, in accordance with some embodiments.

The chips 172 and 174 include a system-on-chip (SoC), a memory chip (e.g., a dynamic random access memory chip), a radio frequency (RF) chip, or another suitable chip. The chips 172 and 174 and the chip package 176 may have the same or different widths. The chips 172 and 174 and the chip package 176 may have the same or different heights.

The chip 172 has a substrate 172a, a device layer 172b, and an interconnect layer 172c, in accordance with some embodiments. In some embodiments, the substrate 172a is made of an elementary semiconductor material including silicon or germanium in a single crystal, polycrystal, or amorphous structure. In some other embodiments, the substrate 172a is made of a compound semiconductor, such as silicon carbide, gallium arsenide, gallium phosphide, indium phosphide, indium arsenide, an alloy semiconductor, such as SiGe, or GaAsP, or a combination thereof.

The substrate 172a may also include multi-layer semiconductors, semiconductor on insulator (SOI) (such as silicon on insulator or germanium on insulator), or a combination thereof. The substrate 172a has a bottom surface B1 facing the redistribution structure 160, in accordance with some embodiments.

The device layer 172b is over the bottom surface B1, in accordance with some embodiments. The device layer 172b includes electronic elements (not shown), a dielectric layer DI1, and conductive pads P1, in accordance with some embodiments.

In some embodiments, electronic elements are formed on or in the substrate 172a. The electronic elements include active elements (e.g. transistors, diodes, or the like) and/or passive elements (e.g. resistors, capacitors, inductors, or the like), in accordance with some embodiments. The dielectric layer DI1 is formed over the bottom surface B1 and covers the electronic elements, in accordance with some embodiments.

The conductive pads P1 are embedded in the dielectric layer DI1 and are electrically connected to the electronic elements, in accordance with some embodiments. The conductive pads P1 are made of a conductive material, such as metal (e.g., copper, aluminum, nickel, or combinations thereof), in accordance with some embodiments.

The interconnect layer 172c is formed over the device layer 172b, in accordance with some embodiments. The interconnect layer 172c includes an interconnect structure (not shown) and a dielectric layer (not shown), in accordance with some embodiments. The interconnect structure is in the dielectric layer and electrically connected to the conductive pads P1, in accordance with some embodiments.

The conductive bumps 182 are between the conductive pads 166 and the interconnect layer 172c to electrically connect the conductive pads 166 to the conductive pads P1 through the interconnect structure of the interconnect layer 172c, in accordance with some embodiments.

The chip 174 has a substrate 174a, a device layer 174b, and an interconnect layer 174c, in accordance with some embodiments. In some embodiments, the substrate 174a is made of an elementary semiconductor material including silicon or germanium in a single crystal, polycrystal, or amorphous structure. In some other embodiments, the substrate 174a is made of a compound semiconductor, such as silicon carbide, gallium arsenide, gallium phosphide, indium phosphide, indium arsenide, an alloy semiconductor, such as SiGe, or GaAsP, or a combination thereof.

The substrate 174a may also include multi-layer semiconductors, semiconductor on insulator (SOI) (such as silicon on insulator or germanium on insulator), or a combination thereof. The substrate 174a has a bottom surface B2 facing the redistribution structure 160, in accordance with some embodiments. The device layer 174b is over the bottom surface B2, in accordance with some embodiments. The device layer 174b includes electronic elements (not shown), a dielectric layer DI2, and conductive pads P2, in accordance with some embodiments.

In some embodiments, electronic elements are formed on or in the substrate 174a. The electronic elements include active elements (e.g. transistors, diodes, or the like) and/or passive elements (e.g. resistors, capacitors, inductors, or the like), in accordance with some embodiments. The dielectric layer DI2 is formed over the bottom surface B2 and covers the electronic elements, in accordance with some embodiments.

The conductive pads P2 are embedded in the dielectric layer DI2 and are electrically connected to the electronic elements, in accordance with some embodiments. The conductive pads P2 are made of a conductive material, such as metal (e.g., copper, aluminum, nickel, or combinations thereof), in accordance with some embodiments.

The interconnect layer 174c is formed over the device layer 174b, in accordance with some embodiments. The interconnect layer 174c includes an interconnect structure (not shown) and a dielectric layer (not shown), in accordance with some embodiments. The interconnect structure is in the dielectric layer and electrically connected to the conductive pads P2, in accordance with some embodiments.

The conductive bumps 184 are between the conductive pads 166 and the interconnect layer 174c to electrically connect the conductive pads 166 to the conductive pads P2 through the interconnect structure of the interconnect layer 174c, in accordance with some embodiments.

In some embodiments, the chip package 176 includes a redistribution structure (or a substrate) 176a, a chip 176b, conductive bumps 176c, and a molding layer 176d, in accordance with some embodiments. The redistribution structure 176a includes a dielectric layer (not shown) and wiring layers (not shown), in accordance with some embodiments. The wiring layers are in the dielectric layer, in accordance with some embodiments.

The chip 176b is bonded to the redistribution structure 176a through the conductive bumps 176c, in accordance with some embodiments. The chip 176b includes a dynamic random access memory (DRAM) chip, a high bandwidth memory (HBM) chip, or another suitable chip.

The conductive bumps 176c electrically connect the chip 176b to the wiring layers of the redistribution structure 176a, in accordance with some embodiments. The conductive bumps 176c are made of a solder material, such as Sn and Ag or another suitable conductive material (e.g., gold), in accordance with some embodiments.

The molding layer 176d is formed over the redistribution structure 176a to surround the chip 176b and the conductive bumps 176c, in accordance with some embodiments. The molding layer 176d is made of a polymer material or another suitable insulating material.

The conductive bumps 186 are between the conductive pads 166 and the redistribution structure 176a to electrically connect the conductive pads 166 to the chip 176b through the wiring layers of the redistribution structure 176a and the conductive bumps 176c, in accordance with some embodiments.

The conductive bump 186 is wider than the conductive bump 182 or 184, in accordance with some embodiments. The conductive bumps 182 or 184 are also referred to as micro bumps, in accordance with some embodiments. The conductive bumps 186 are also referred to as C4 bumps, in accordance with some embodiments.

In some embodiments, a width W3 of the conductive bump 182 ranges from about 10 μm to about 150 μm. In some embodiments, the width W3 of the conductive bump 182 ranges from about 40 μm to about 50 μm. In some embodiments, a width W4 of the conductive bump 184 ranges from about 10 μm to about 150 μm. In some embodiments, the width W4 of the conductive bump 184 ranges from about 40 μm to about 50 μm. In some embodiments, a width W5 of the conductive bump 186 ranges from about 50 μm to about 250 μm. In some embodiments, a width W5 of the conductive bump 186 ranges from about 100 μm to about 150 μm.

The conductive bumps 182, 184, and 186 are made of a solder material, such as Sn and Ag or another suitable conductive material (e.g., gold), in accordance with some embodiments. The conductive bumps 182, 184, and 186 are solder balls, in accordance with some embodiments.

As shown in FIG. 1E, an underfill layer 190 is formed between the chips 172 and 174, the chip package 176, and the redistribution structure 160, in accordance with some embodiments. The underfill layer 190 surrounds the chips 172 and 174, the chip package 176, and the conductive bumps 182, 184, and 186, in accordance with some embodiments. The underfill layer 190 is made of an insulating material, such as a polymer material or a molding compound material consisting of epoxy and filler material, in accordance with some embodiments.

The coefficient of thermal expansion (CTE) balance is achieved among the CTE of the substrate 130, the CTE of the molding layer 150, and the CTE of the carrier substrate 110, in accordance with some embodiments. Therefore, the warpage of the substrate 130 is reduced, in accordance with some embodiments. Therefore, the coplanarity of conductive bumps subsequently formed over the surface 131b is improved.

Since the conductive structures 147, the molding layer 150, and the redistribution structure 160 are sequentially formed over the substrate 130 with good coplanarity, the conductive structures 147, the molding layer 150, and the redistribution structure 160 have a good coplanarity, which improves the bondability between the conductive bumps 182, 184, and 186 and the redistribution structure 160.

Figure 1F:
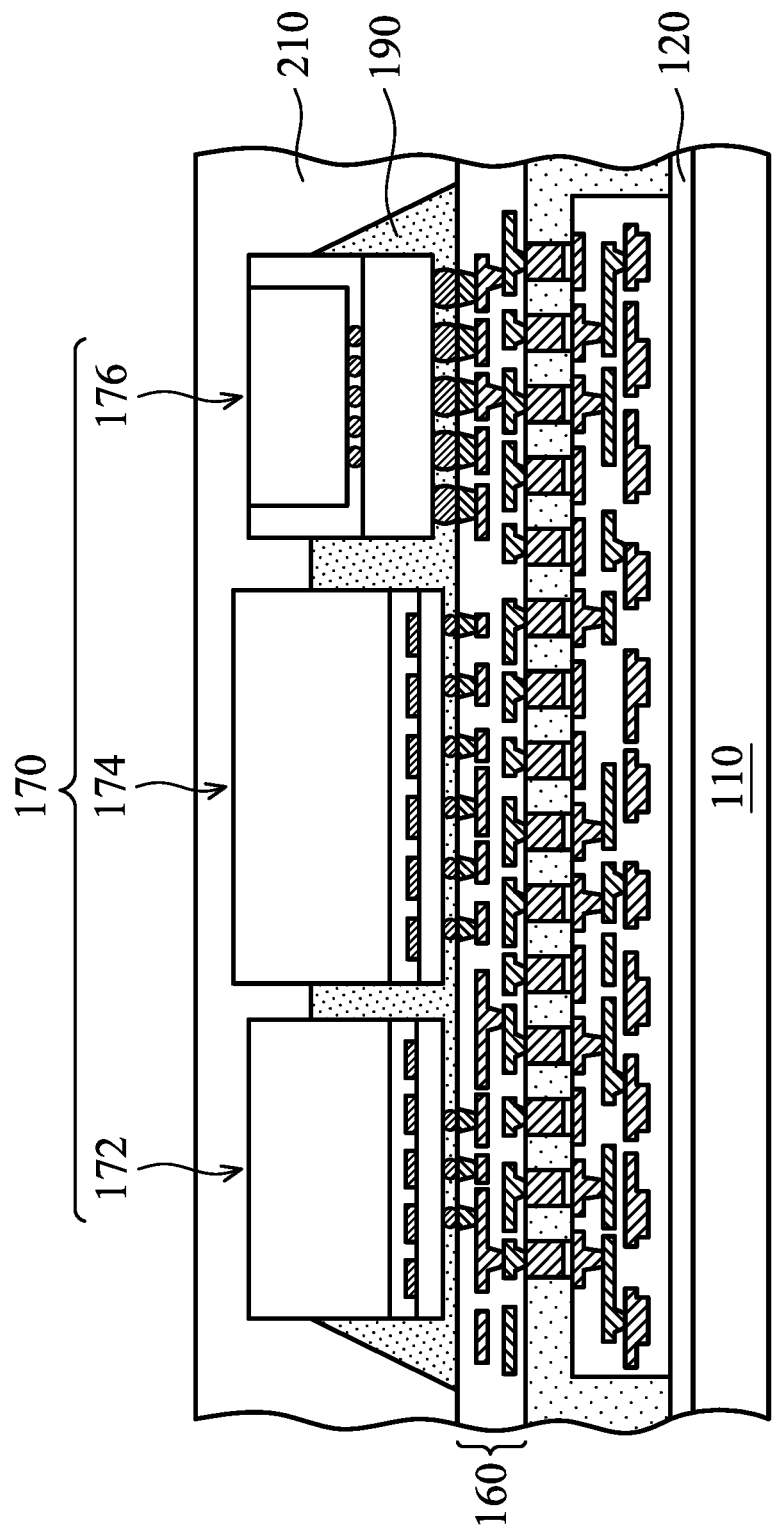

As shown in FIG. 1F, a molding layer 210 is formed over the redistribution structure 160, the underfill layer 190, the chips 172 and 174, and the chip package 176, in accordance with some embodiments. The molding layer 210 includes a polymer material, in accordance with some embodiments. The molding layer 210 is formed using a molding process, in accordance with some embodiments.

Figure 1G:
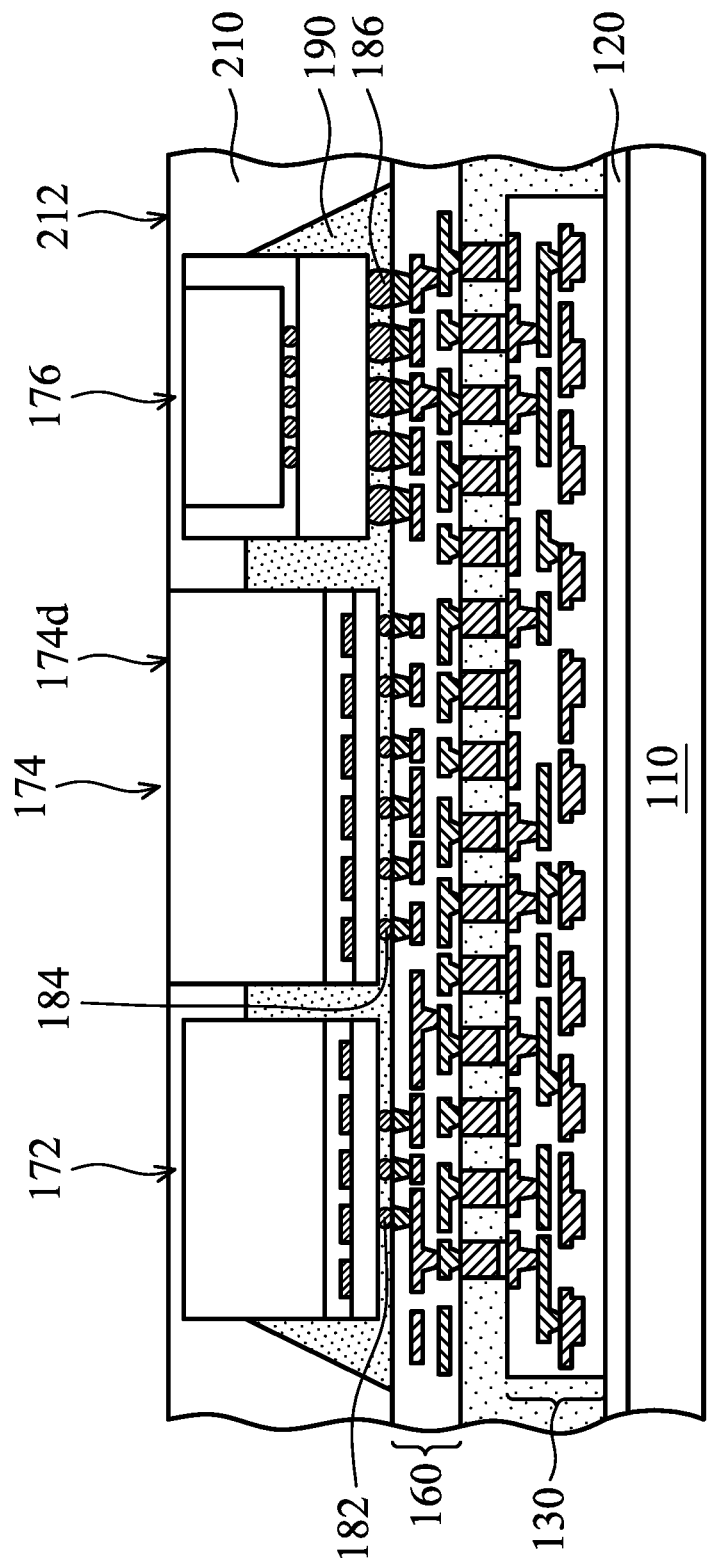

As shown in FIG. 1G, an upper portion of the molding layer 210 is removed to expose a top surface 174d of the chip 174, in accordance with some embodiments. Therefore, the heat dissipation efficiency of the chip 174 is improved, in accordance with some embodiments.

The removal process includes a planarization process such as a chemical mechanical polishing process (CMP process), in accordance with some embodiments. Therefore, after the removal process, the top surface 174d is coplanar with a top surface 212 of the molding layer 210, in accordance with some embodiments. In some other embodiments (not shown), the top surface 174d and 212 and the top surfaces of the chip 172 and the chip package 176 are coplanar with each other.

The molding layer 210 surrounds the chips 172 and 174 and the chip package 176, the conductive bumps 182, 184, and 186, and the underfill layer 190, in accordance with some embodiments. The molding layer 210 is in direct contact with the chips 172 and 174 and the chip package 176 and the underfill layer 190, in accordance with some embodiments.

Figure 1H:
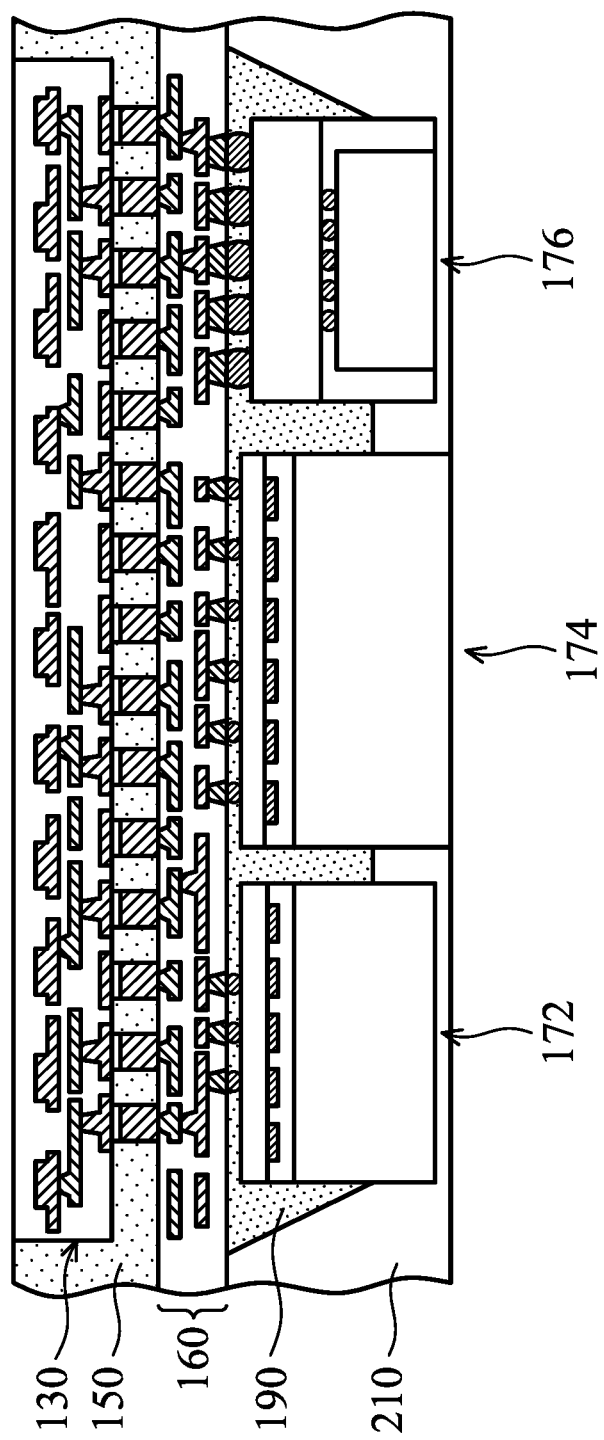

As shown in FIG. 1H, the substrate 130 is flipped upside down, in accordance with some embodiments. As shown in FIG. 1H, the carrier substrate 110 is removed, in accordance with some embodiments. As shown in FIG. 1H, the adhesive layer 120 is removed, in accordance with some embodiments.

Figure 1I:
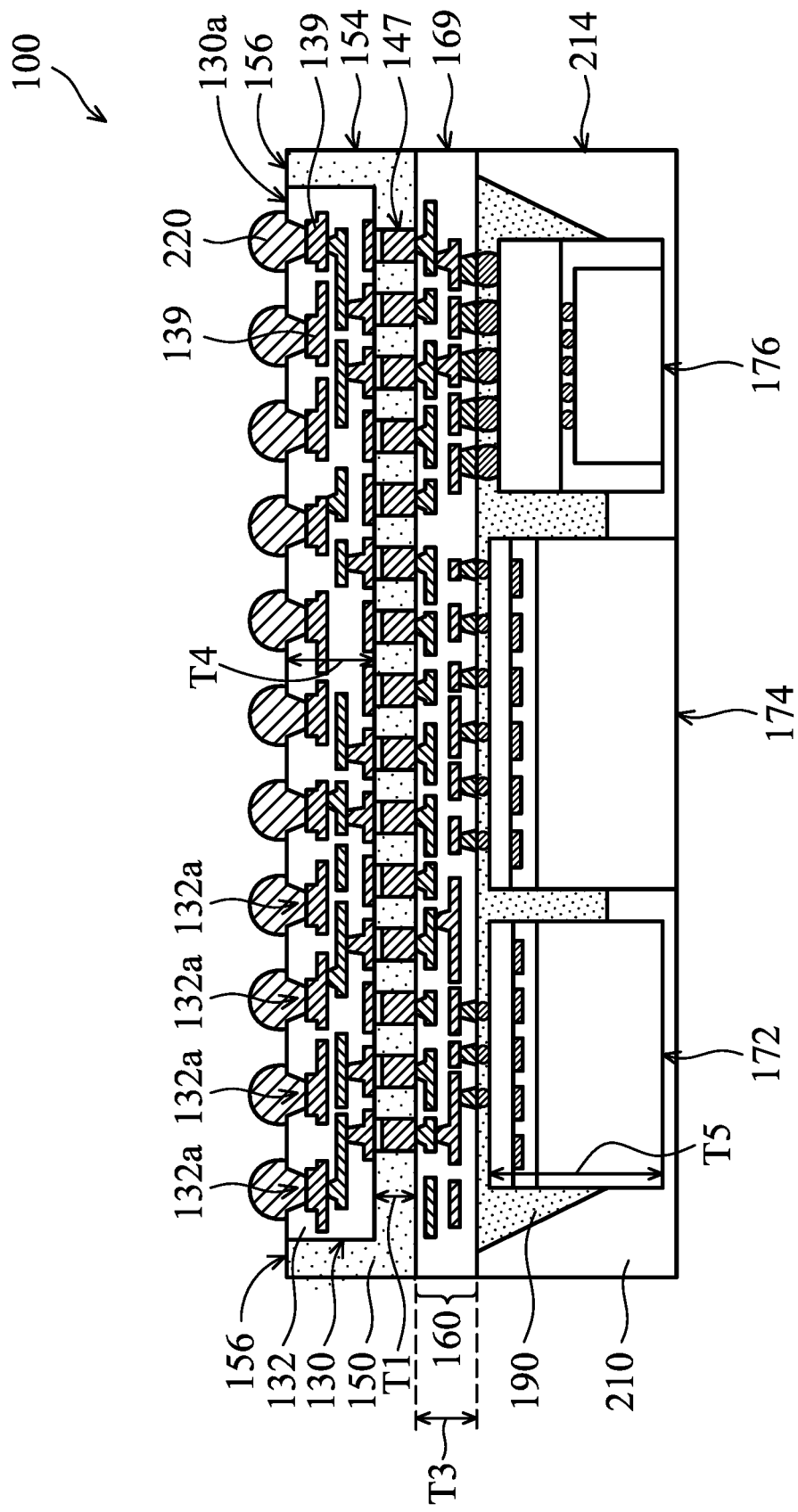

As shown in FIG. 1I, portions of the dielectric layer 132 are removed to form openings 132a in the dielectric layer 132, in accordance with some embodiments. The openings 132a expose the conductive pads 139 thereunder, in accordance with some embodiments.

As shown in FIG. 1I, conductive bumps 220 are respectively formed over the conductive pads 139 exposed by the openings 132a, in accordance with some embodiments. The conductive bumps 220 are made of a solder material, such as Sn and Ag or another suitable conductive material, in accordance with some embodiments.

As shown in FIG. 1I, a cutting process (or a sawing process) is performed on the molding layer 150, the redistribution structure 160, and the molding layer 210 to cut through the molding layer 150 and 210 and the redistribution structure 160 so as to form chip package structures 100, in accordance with some embodiments. For the sake of simplicity, FIG. 1I only shows one of the chip package structures 100, in accordance with some embodiments.

In some embodiments, a sidewall 154 of the molding layer 150, a sidewall 169 of the redistribution structure 160, and a sidewall 214 of the molding layer 210 are coplanar with each other after the cutting process. In some embodiments, a surface 130a of the substrate 130 is coplanar with a surface 156 of the molding layer 150. The thickness T1 of the conductive structure 147 is less than each of the thickness T3 of the redistribution structure 160, the thickness T4 of the substrate 130, and the thickness T5 of the chip 172, in accordance with some embodiments.

Since the redistribution structure 160 is electrically connected to the substrate 130 through the conductive structures 147 (which is formed by a plating process), not solder balls, there is no need to perform an annealing process to bond the solder balls to the substrate 130, in accordance with some embodiments. Therefore, the warpage of the substrate 130 is reduced, in accordance with some embodiments.

Furthermore, the conductive structures 147 are formed over the substrate 130 by a plating process, and therefore the formation of the conductive structures 147 is not affected by the warpage of the substrate 130. Therefore, the bondability between the conductive structures 147 and the substrate 130 is improved, in accordance with some embodiments.

Since the conductive structures 147 are formed by forming the conductive layer 146 in the openings 144a of the mask layer 144, the sizes of the conductive structures 147 and the distance between two adjacent conductive structures 147 are adjustable by adjusting the openings 144a of the mask layer 144 (as shown in FIGS. 1A and 1B) using a photolithography process, in accordance with some embodiments. Therefore, the sizes of the conductive structures 147 and the distance between two adjacent conductive structures 147 may be less than and/or more uniform than that of/between solder balls. As a result, a density of the conductive structures 147 is improved.

In accordance with some embodiments, chip package structures and methods for forming the same are provided. The methods (for forming the chip package structure) include forming conductive structures between a substrate and a redistribution structure using a plating process. Therefore, the bondability between the conductive structures and the substrate is not affected by the warpage of the substrate. As a result, the electrical connection property between the substrate and the redistribution structure is improved.

In accordance with some embodiments, a method for forming a chip package structure is provided. The method includes forming a conductive structure over a substrate. The substrate includes a dielectric layer and a wiring layer in the dielectric layer, and the conductive structure is electrically connected to the wiring layer. The method includes forming a first molding layer over the substrate and surrounding the conductive structure. The method includes forming a redistribution structure over the first molding layer and the conductive structure. The method includes bonding a chip structure to the redistribution structure.

In accordance with some embodiments, a method for forming a chip package structure is provided. The method includes forming a conductive structure over a substrate. The substrate includes a dielectric layer and a wiring layer in the dielectric layer, and the conductive structure is electrically connected to the wiring layer. The method includes forming a first molding layer over the substrate to surround the conductive structure. The method includes removing the first molding layer over the conductive structure. The method includes forming a redistribution structure over the first molding layer and the conductive structure. The redistribution structure is in direct contact with the conductive structure. The method includes bonding a chip structure to the redistribution structure.

In accordance with some embodiments, a chip package structure is provided. The chip package structure includes a substrate comprising a dielectric layer and a wiring layer in the dielectric layer. The substrate has a first surface and a sidewall, and the sidewall is adjacent to the first surface. The chip package structure includes a conductive structure over the first surface and electrically connected to the wiring layer. The chip package structure includes a first molding layer over the first surface and the sidewall to surround the conductive structure and the substrate. The chip package structure includes a redistribution structure over the first molding layer and the conductive structure. The chip package structure includes a chip structure over the redistribution structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a chip package structure, comprising:
    forming a wiring layer in a dielectric layer, wherein the dielectric layer is made of polymer;
    forming a conductive structure over the dielectric layer, wherein the conductive structure is electrically connected to the wiring layer;
    forming a first molding layer over the dielectric layer and surrounding the conductive structure and the dielectric layer, wherein a bottom surface of the dielectric layer and a bottom surface of the first molding layer face an identical direction;
    forming a redistribution structure over the first molding layer and the conductive structure; and
    bonding a chip structure to the redistribution structure to form the chip package structure, wherein the bottom surface of the dielectric layer and the bottom surface of the first molding layer are exposed from the chip package structure.

2. The method for forming the chip package structure as claimed in claim 1, wherein the first molding layer continuously covers a surface and a sidewall of the dielectric layer, the surface faces the redistribution structure, and the sidewall is adjacent to and surrounds the surface.

3. The method for forming the chip package structure as claimed in claim 1, further comprising:
forming a conductive bump over the dielectric layer after bonding the chip structure to the redistribution structure, wherein the dielectric layer is between the conductive bump and the redistribution structure.

4. The method for forming the chip package structure as claimed in claim 3, further comprising:
cutting through the first molding layer and the redistribution structure after forming the conductive bump over the dielectric layer.

5. The method for forming the chip package structure as claimed in claim 4, wherein a first sidewall of the first molding layer and a second sidewall of the redistribution structure are coplanar after cutting through the first molding layer and the redistribution structure.

6. The method for forming the chip package structure as claimed in claim 1, wherein the conductive structure passes through the first molding layer.

7. The method for forming the chip package structure as claimed in claim 1, wherein the redistribution structure is in direct contact with the conductive structure and the first molding layer.

8. The method for forming the chip package structure as claimed in claim 1, wherein the chip structure is electrically connected to the dielectric layer through the redistribution structure and the conductive structure.

9. A method for forming a chip package structure, comprising:
forming a wiring layer in a dielectric layer, wherein the dielectric layer is made of polymer;
forming a conductive structure over the dielectric layer, wherein the conductive structure is electrically connected to the wiring layer;
forming a first molding layer over the dielectric layer to surround the conductive structure;
removing the first molding layer over the conductive structure;
forming a redistribution structure over the first molding layer and the conductive structure, wherein the redistribution structure is in direct contact with the conductive structure;
bonding a chip structure to the redistribution structure,
removing a portion of the dielectric layer to form openings after bonding the chip structure; and
forming bumps in the openings of the dielectric layer.

10. The method for forming the chip package structure as claimed in claim 9, wherein the forming of the conductive structure comprises:
forming a seed layer over the dielectric layer;
forming a mask layer over the seed layer, wherein the mask layer has an opening partially exposing the seed layer;
forming a conductive layer in the opening; and
removing the mask layer and the seed layer under the mask layer, wherein the conductive layer and the seed layer under the conductive layer together form the conductive structure.

11. The method for forming the chip package structure as claimed in claim 9, wherein a first top surface of the first molding layer and a second top surface of the conductive structure are coplanar after removing the first molding layer over the conductive structure.

12. The method for forming the chip package structure as claimed in claim 11, wherein the forming of the redistribution structure over the first molding layer and the conductive structure comprises:
forming the dielectric layer over the first molding layer and the conductive structure, wherein the dielectric layer has an opening exposing the conductive structure; and
forming the wiring layer over the dielectric layer and in the opening to connect to the conductive structure, wherein the chip structure is electrically connected to the wiring layer.

13. A method for forming a chip package structure, comprising:
forming a wiring layer in a dielectric layer, wherein the dielectric layer is made of polymer;
forming a conductive structure over a top surface of the dielectric layer, wherein the conductive structure is electrically connected to the wiring layer;
forming a molding layer over the dielectric layer, wherein the conductive structure is exposed from the first molding layer;
forming a redistribution structure over the molding layer and the conductive structure, wherein the conductive structure is electrically connected to the redistribution structure;
bonding a chip structure to the redistribution structure; and
forming a bump in direct contact with a bottom surface of the dielectric layer to form the chip package structure, wherein the bump is exposed from the chip package structure.

14. The method for forming the chip package structure as claimed in claim 13, further comprising forming an underfill layer partially covering the sidewall of the chip structure, wherein the molding layer partially covers the sidewall of the chip structure.

15. The method for forming the chip package structure as claimed in claim 14, wherein the chip structure comprises a first chip and a second chip, the method further comprises removing a portion of the molding layer to expose a top surface of the first chip, and a top surface of the second chip is covered by the molding layer.

16. The method for forming the chip package structure as claimed in claim 13, further comprises forming conductive bumps between the chip structure and the redistribution structure, wherein the chip structure comprises a first chip and a second chip, the conductive bumps comprises a first conductive bump between the first chip and the redistribution structure and a second conductive bump between the second chip and the redistribution structure, and the width of the first conductive bump and the second conductive bump are different.

17. The method for forming the chip package structure as claimed in claim 13, wherein a first sidewall of the molding layer and a second sidewall of the redistribution structure are coplanar.

18. The method for forming the chip package structure as claimed in claim 3, wherein the conductive bump is in direct contact with the wiring layer in the dielectric layer.

19. The method for forming the chip package structure as claimed in claim 3, wherein the bump overlaps a portion of the dielectric layer in a tangent direction of the dielectric layer.

20. The method for forming the chip package structure as claimed in claim 9, wherein the bumps are in direct contact with a bottom surface of the dielectric layer and exposed from the chip package structure.

\* \* \* \* \*